(12) United States Patent
Liou et al.

(10) Patent No.: US 8,871,529 B2
(45) Date of Patent: Oct. 28, 2014

(54) METHOD FOR MANUFACTURING INTEGRATED CIRCUIT STRUCTURE WITH MAGNETORESISTANCE COMPONENT

(76) Inventors: Fu-Tai Liou, Hsinchu County (TW); Chien-Min Lee, Hsinchu County (TW); Chih-Chien Liang, Hsinchu County (TW); Nai-Chung Fu, Taoyuan County (TW)

(*) Notice: Subject to any disclaimer, the term of this patent is extended or adjusted under 35 U.S.C. 154(b) by 41 days.

(21) Appl. No.: 13/427,875

(22) Filed: Mar. 22, 2012

(65) Prior Publication Data

US 2013/0115719 A1 May 9, 2013

(30) Foreign Application Priority Data

Nov. 7, 2011 (TW) .............................. 100140601 A

(51) Int. Cl.
*H01L 21/00* (2006.01)
*H01L 43/12* (2006.01)

(52) U.S. Cl.
CPC ...................................... *H01L 43/12* (2013.01)
USPC ............................................................. 438/3

(58) Field of Classification Search
CPC ....... H01L 42/08; H01L 42/12; H01L 27/222; H01L 27/228; H01L 27/226; H01L 27/24; H01L 43/12

USPC .............................................................. 438/3
See application file for complete search history.

(56) References Cited

U.S. PATENT DOCUMENTS

| 6,403,461 | B1* | 6/2002 | Tae et al. .................... 438/619 |
| 7,723,827 | B2* | 5/2010 | Katoh .......................... 257/659 |
| 2005/0232003 | A1* | 10/2005 | Park et al. ................... 365/158 |
| 2006/0017180 | A1* | 1/2006 | Sarma .......................... 257/797 |
| 2006/0276034 | A1 | 12/2006 | Blanchard |
| 2010/0264501 | A1* | 10/2010 | Furuta et al. ................ 257/421 |

* cited by examiner

*Primary Examiner* — Shaun Campbell
(74) *Attorney, Agent, or Firm* — Alan Kamrath; Kamrath IP Lawfirm, P.A.

(57) ABSTRACT

A method or manufacturing an integrated circuit structure with a magnetoresistance component is provided. A substrate is provided. A circuit structure layer including a metal pad is formed on the substrate. A dielectric layer is formed on the circuit structure. A metal damascene structure is formed in the dielectric layer. An opening is formed in the dielectric layer so as to form a step-drop. A magnetoresistance material layer is formed on the dielectric layer after forming the metal damascene structure and the opening. A photolithography process is applied to pattern the magnetoresistance material layer to form a magnetoresistance component electrically connected to the metal damascene structure.

17 Claims, 3 Drawing Sheets

METHOD FOR MANUFACTURING INTEGRATED CIRCUIT STRUCTURE WITH MAGNETORESISTANCE COMPONENT

FIELD OF THE INVENTION

The present invention relates to a method for manufacturing a magnetoresistance component, and particularly to a method for manufacturing an integrated circuit structure with a magnetoresistance component.

BACKGROUND OF THE INVENTION

Recently, a magnetoresistance component has been widely employed for electronic apparatuses because the magnetoresistance component has a function of changing the value of its electrical resistance with the variation of an external magnetic field applied to it. Generally, it is necessary for the magnetoresistance component to be cooperated with a peripheral integrated circuit to achieve its function. Thus, it is desired that the magnetoresistance component can be integrated with the peripheral integrated circuit on a common substrate in an integrated circuit manufacturing process. However, in a typical integrated circuit manufacturing process, it is difficult to integrate the magnetoresistance component with the peripheral integrated circuit on a common substrate on condition that the performance of the magnetoresistance component is not affected.

SUMMARY OF THE INVENTION

The present invention provides a method for manufacturing an integrated circuit structure with a magnetoresistance component so that the magnetoresistance component can be easily integrated with an integrated circuit on a common substrate and the performance of the magnetoresistance component is not affected.

The present invention provides a method for manufacturing an integrated circuit structure with a magnetoresistance component. A substrate is provided. A circuit structure layer including a metal pad is formed on the substrate. A dielectric layer is formed on the circuit structure layer. A metal damascene structure is formed in the dielectric layer. An opening is formed in the dielectric layer so as to form a step-drop. A magnetoresistance material layer is formed on the dielectric layer after forming the metal damascene structure and the opening. A photolithography process is applied to pattern the magnetoresistance material layer to form a magnetoresistance component electrically connected to the metal damascene structure. A passivation layer is conformally formed on the dielectric layer so as to cover the magnetoresistance component and to fill into the opening. The passivation layer and the dielectric layer above the metal pad are removed so as to expose the metal pad.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
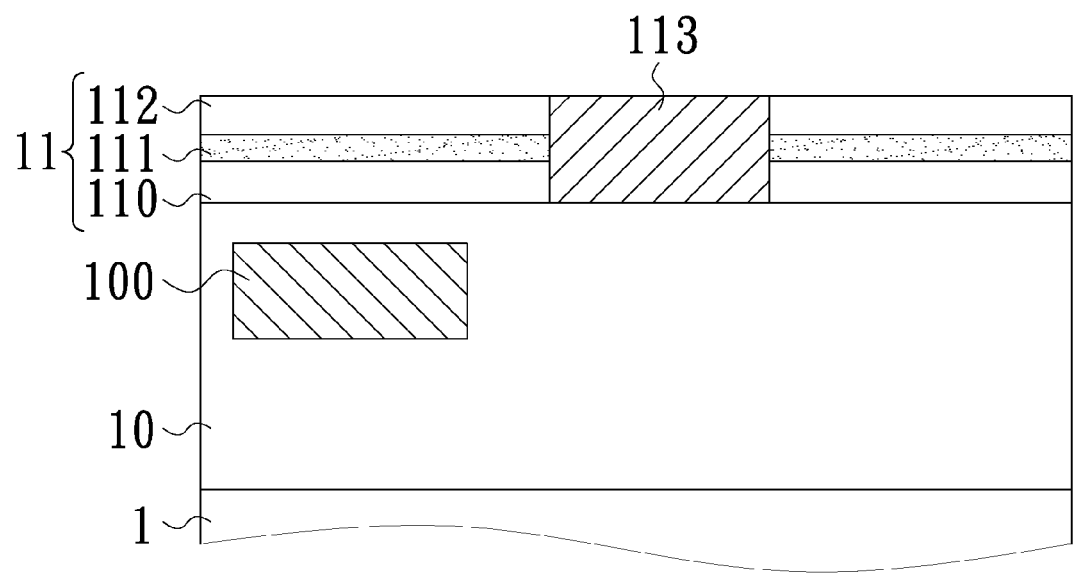
FIGS. 1A to 1D illustrates a process flow of a method manufacturing an integrated circuit structure with a magnetoresistance component in accordance with an embodiment of the present invention.

FIGS. 1A to 1D illustrates a process flow of a method manufacturing an integrated circuit structure with a magnetoresistance component in accordance with an embodiment of the present invention. Referring to FIG. 1A, a substrate 1 is provided. A circuit structure layer 10 for example a metal interconnection structure layer is formed on the substrate 1. The circuit structure layer 10 for example the metal interconnection structure layer can include a circuit (not shown) such as a set circuit, a reset circuit or an offset circuit. It is noted that, the circuit structure layer 10 also includes a metal pad 100. A dielectric layer 11 is formed on the circuit structure layer 10. The dielectric layer 11 can be a single layer structure or a multiple layer structure. For example, the dielectric layer 11 can be a silicon oxide layer, a silicon nitride layer, or a combination thereof on the circuit structure layer. In the present embodiment, the dielectric layer 11 is the multiple layer structure including a silicon oxide layer 110, a silicon nitride layer 111, and a silicon oxide layer 112. The silicon oxide layer 110, the silicon nitride layer 111, and the silicon oxide layer 112 are formed on the circuit structure layer 10 in that order. A metal damascene structure 113 here refers to a metal structure embedded in the dielectric layer 11 with an exposed top surface. The metal damascene structure 113 is in direct contact with a magnetoresistance component 115 formed in a subsequent step. The exposed top surface of metal damascene structure 113 is configured either partially or fully enclosed by the magnetoresistance component 115. The patterns of the metal damascene structure 113 can be line-shaped or a large area with slots. The metal damascene structure 113 is electrically connected to the magnetoresistance component 115 only or provides an electrical connection between the magnetoresistance component 115 and the circuit structure layer 10. In the present embodiment, the metal damascene structure 113 is formed by using a conventional single-damascene process (as shown in FIG. 1A). In another embodiment, the metal damascene structure 113 can be formed by a dual-damascene process (as shown in FIG. 2). In such cases the metal damascene structure 113 is made of tungsten or copper.

In still another embodiment, the metal damascene structure 113 can be formed by forming a metal structure first, followed by a dielectric deposition and polishing process. In the dielectric deposition and polishing process, a dielectric material layer is formed on the metal structure and then is polished for planarization to form the dielectric layer 11 and expose a top surface of the metal structure. The metal structure can be made of conventional metallic materials which can be patterned by chemical etch, such as pure elements or alloys comprising aluminum, titanium, and tantalum.

Still referring to FIG. 1A, during formation of the metal damascene structure 113, a planarization process is generally performed. Thus, a top surface of the dielectric layer 11 and a top surface of the metal damascene structure 113 form a common flat plane, which is beneficial for the performance of magnetoresistance component 115. However, too flat top surfaces may not be convenient for a subsequent photolithography process of forming a magnetoresistance component 115. In the present embodiment, the following steps are further performed so that the manufacturing inconvenience caused by the flat top surfaces can be solved.

Figure 1B:
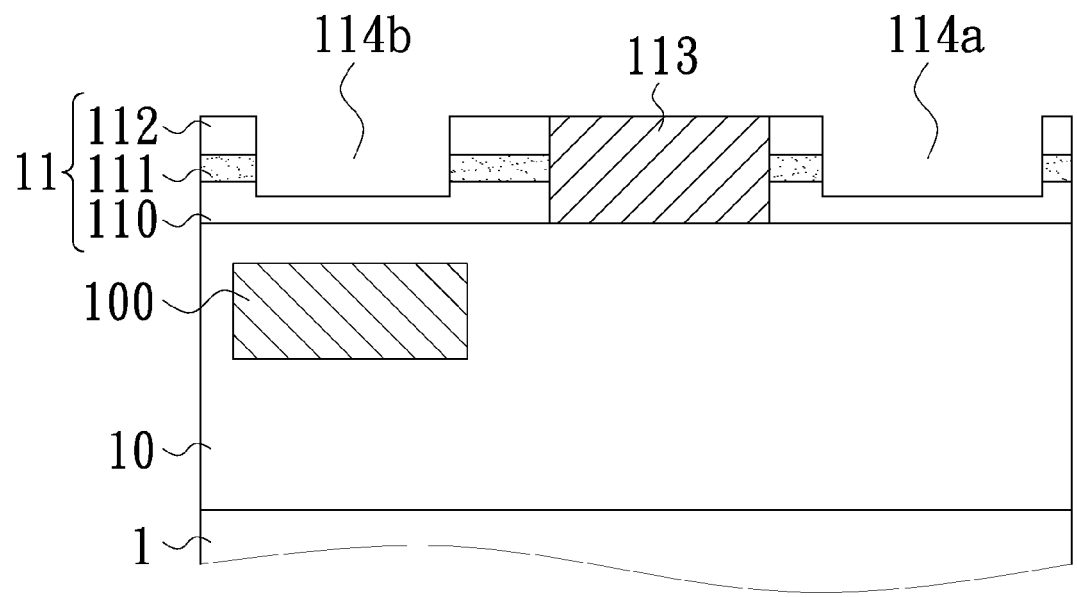
Figure 2:
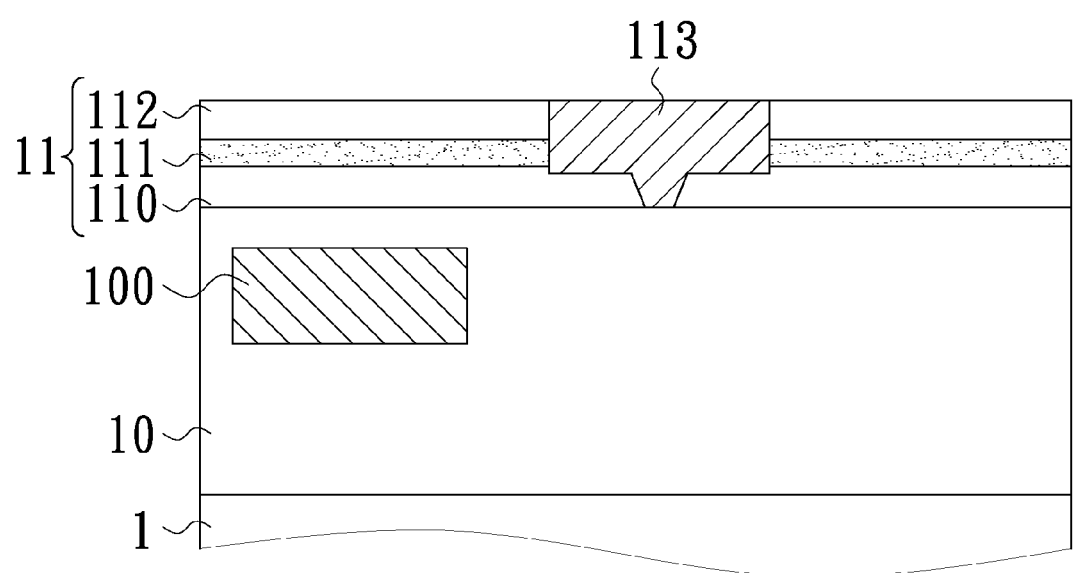
FIG. 2 illustrates a metal damascene structure formed in a dielectric layer in accordance with another embodiment of the present invention.

Referring to FIG. 1B, a number of openings 114a, 114b are formed in the dielectric layer 11 by a photolithography and etching process. The openings 114a, 114b in the dielectric layer 11 form a number of step-drops. The step-drop of the opening 114a can be located in the scribe line region and configured for defining a number of alignment marks for a subsequent photolithography process. The opening 114b can be located above the metal pad 100 for the purpose of reducing pad etching depth. A depth of the openings 114a, 114b can be less than the thickness of the dielectric layer 11. That is, only a portion of the dielectric layer 11 is removed to form the openings 114a, 114b. In another embodiment, a depth of the openings 114a, 114b can be equal to the thickness of the dielectric layer 11. That is, the dielectric layer 11 is completely etched through to form the openings 114a, 114b. In still another embodiment, a depth of the openings 114a, 114b can be greater than the thickness of the dielectric layer 11. That is, the dielectric layer 11 is etched through and a portion of the dielectric layers of the circuit structure layer 10 is removed to form the openings 114a, 114b.

In the present embodiment, only one magnetoresistance component 115 is shown. In another embodiment, the substrate can define a magnetoresistance array region (not shown) for arranging a number of magnetoresistance components. The opening 114a can also be defined in the magnetoresistance array region for specific designs of the magnetoresistance components.

Figure 1C:
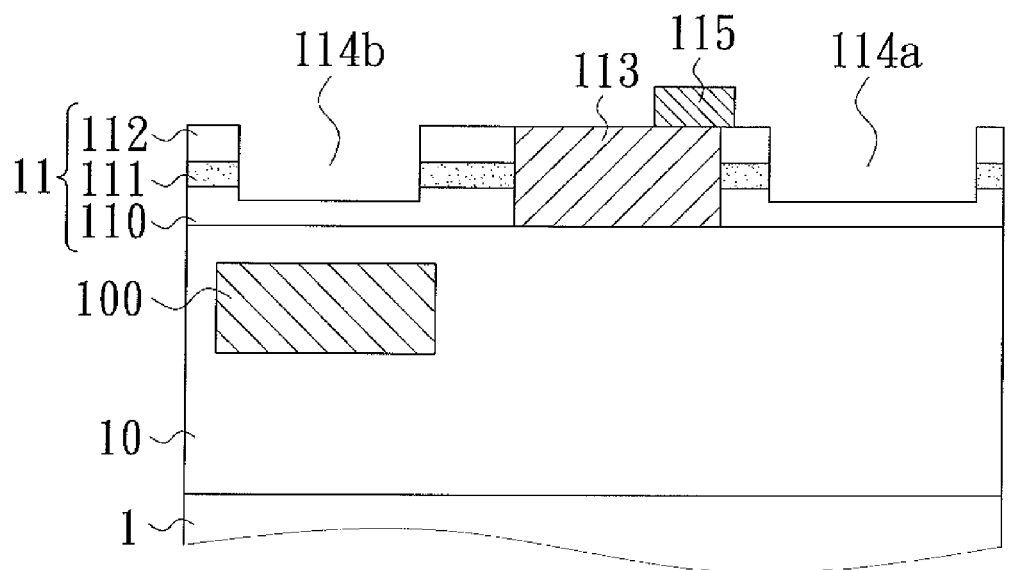

Next, referring to FIG. 1C, a magnetoresistance material layer (not shown) is formed on the dielectric layer 11 after forming the openings 114a, 114b. The magnetoresistance material layer can be a single-layer structure or a multiple-layer structure. Because the magnetoresistance material layer is generally opaque, the alignment marks of previous metal layers can not be optically recognized through the coverage of the magnetoresistance material layer, thereby losing their alignment function. However, for example, in the present embodiment, the alignment mark defined by the opening 114a can still be recognized due to its topographic (step-drop) signal even an opaque magnetoresistance material layer is covered. That is, the step-drop of the opening 114a can be configured for defining the alignment mark for a subsequent photolithography process. In the present embodiment, a photolithography process using the step-drop alignment mark is applied to pattern the magnetoresistance material layer to form a magnetoresistance component 115 electrically connected to the metal damascene structure 113.

Figure 1D:
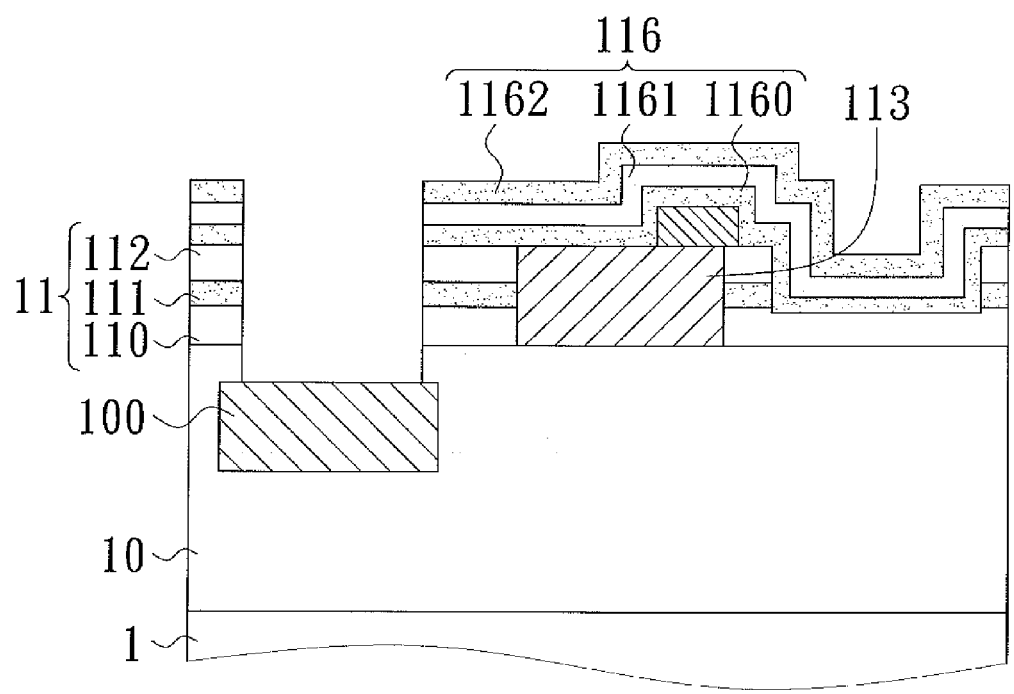

Referring to FIG. 1D, next a passivation layer 116 is conformally deposited to protect the magnetoresistance component 115. The passivation layer 116 is configured for preventing the magnetoresistance component 115 from contaminations and damages. The passivation layer 116 can be formed by a low thermal budget process. The passivation layer 116 can be a single-layer structure or a multiple-layer structure. For example, the passivation layer can be a silicon nitride layer, a silicon oxide layer, or a combination thereof on the dielectric layer. In the present embodiment, the passivation layer 116 is the multiple layer structure including a silicon nitride layer 1160, a silicon oxide layer 1161, and a silicon nitride layer 1162. The silicon nitride layer 1160, the silicon oxide layer 1161, and the silicon nitride layer 1162 are formed in that order. In other embodiment, the passivation layer 116 can be the single layer structure including a silicon nitride layer. Next, the passivation layer 116 as well as the dielectric layer 11 above the metal pad 100 can be removed so as to expose the metal pad 100. Due to the previously formed opening 114b above the metal pad 100, the etching amount of the dielectric layer 11 for exposing the metal pad 100 is greatly reduced.

It is noted that, the substrate 1 can be a silicon substrate or a silicon substrate covered by a dielectric material layer, a silicon germanium (SiGe) layer, a gallium arsenide (GaAs) layer, a silicon carbide (SiC) layer and so on. It is also noted that, an integrated circuit, for example, an application-specific integrated circuit (ASIC), a logic integrated circuit, an analog integrated circuit and a mixed-mode integrated circuit, can be formed on the substrate 1. By using the method according to the present embodiment, as shown in FIG. 1D, an integrated circuit structure with the magnetoresistance component 115 can be formed. The magnetoresistance component 115 can be an anisotropic magnetoresistance (AMR) component, a giant magnetoresistance (GMR) component, a tunneling magnetoresistance (TMR) component or a colossal magnetoresistance (CMR) component.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing an integrated circuit structure with a magnetoresistance component, comprising:
   providing a substrate;
   forming a circuit structure layer on the substrate, the circuit structure layer comprising a metal pad;
   forming a dielectric layer on the circuit structure layer;
   forming a metal damascene structure in the dielectric layer;
   forming an opening in the dielectric layer so as to form a step-drop;
   after forming the metal damascene structure and the opening, forming a magnetoresistance material layer on the dielectric layer; and
   applying a photolithography process to pattern the magnetoresistance material layer to form a magnetoresistance component electrically connected to the metal damascene structure;
   conformally forming a passivation layer on the dielectric layer so as to cover the magnetoresistance component and to fill into the opening; and
   removing the passivation layer and the dielectric layer above the metal pad so as to expose the metal pad.

2. The method of claim 1, wherein the substrate is either a silicon substrate or a silicon substrate covered by a dielectric material layer, a silicon germanium (SiGe) layer, a gallium arsenide (GaAs) layer or a silicon carbide (SiC) layer.

3. The method of claim 1, wherein the circuit structure layer is a metal interconnection structure layer.

4. The method of claim 1, wherein forming the dielectric layer comprises forming a silicon oxide layer, a silicon nitride layer, or a combination thereof on the circuit structure layer.

5. The method of claim 1, wherein forming the metal damascene structure comprises a planarization process.

6. The method of claim 1, wherein the metal damascene structure is a metal structure embedded in the dielectric layer with an exposed top surface.

7. The method of claim 1, wherein a pattern of the metal damascene structure is line-shaped or a large area with slots.

8. The method of claim 1, wherein the metal damascene structure is formed by using a single-damascene process or a dual-damascene process.

9. The method of claim 1, wherein forming the metal damascene structure comprises:
   forming a metal structure;
   forming a dielectric material layer on the metal structure; and
   polishing the dielectric material layer for planarization and expose a top surface of the metal structure.

10. The method of claim 1, wherein a material of the metal damascene structure is selected from a group consisting of tungsten, copper and aluminum.

11. The method of claim 1, wherein the opening is located in a scribe-line region.

12. The method of claim 1, wherein the opening is located above the metal pad.

13. The method of claim 1, wherein the substrate defines a magnetoresistance array region, and the opening is located in the magnetoresistance array region.

14. The method of claim 1, wherein a depth of the opening is less than or equal to a thickness of the dielectric layer.

15. The method of claim 1, wherein a depth of the opening is greater than or equal to a thickness of the dielectric layer.

16. The method of claim 1, wherein the magnetoresistance component is selected from a group consisting of an anisotropic magnetoresistance (AMR) component, a giant magnetoresistance (GMR) component, a tunneling magnetoresistance (TMR) component and a colossal magnetoresistance (CMR) component.

17. The method of claim 1, wherein forming the passivation layer comprises forming a silicon nitride layer, a silicon oxide layer, or a combination thereof on the dielectric layer.

* * * * *